United States Patent [19]

Jalali

[11] Patent Number: 4,825,402
[45] Date of Patent: Apr. 25, 1989

[54] MULTICONFIGURABLE INTERFACE DRIVER/RECEIVER CIRCUIT FOR A COMPUTER PRINTER PERIPHERAL ADAPTOR

[75] Inventor: Bahman Jalali, San Diego, Calif.

[73] Assignee: NCR Corporation, Dayton, Ohio

[21] Appl. No.: 848,666

[22] Filed: Apr. 4, 1986

[51] Int. Cl.⁴ .............................................. G06F 3/00
[52] U.S. Cl. ...................................... 364/900; 375/36
[58] Field of Search ... 364/200 MS File, 900 MS File; 307/219, 241, 270, 490, 494; 340/825; 375/36, 121; 333/17 M

[56] References Cited

U.S. PATENT DOCUMENTS

| | | | |
|---|---|---|---|
| 4,124,889 | 11/1978 | Kaufman et al. | 364/200 |
| 4,426,166 | 1/1984 | Bowling | 375/121 |
| 4,514,823 | 4/1985 | Mendelson | 364/900 |
| 4,647,912 | 3/1987 | Bates et al. | 375/36 |

OTHER PUBLICATIONS

IBM Tech, Disc. Bulletin, vol. 29, No. 1, Jun. 1986, pp. 185–186.

Primary Examiner—Raulfe B. Zache
Assistant Examiner—Florin Munteanu
Attorney, Agent, or Firm—Wilbert Hawk, Jr.; Edward Dugas; Floyd A. Gonzalez

[57] ABSTRACT

A single interface circuit for use with a computer peripheral having drivers and receivers which may be configured to be compatible with either short line input/output cables or long line input/output cables. Jumpers are provided to configure the interface circuit as desired.

7 Claims, 9 Drawing Sheets

PRIOR ART

MULTICONFIGURABLE INTERFACE DRIVER/RECEIVER CIRCUIT FOR A COMPUTER PRINTER PERIPHERAL ADAPTOR

BACKGROUND OF THE INVENTION

The present invention relates to interface circuits for use with printers in a computer system, and is more particularly related to a single interface whose configuration may be changed dependent upon the length of the input/output cable between the printer and a host processor in the computer system.

In many computer systems, a host processor is provided having a peripheral port for providing data bits in a serial format. A peripheral adapter is provided for performing a serial-to-parallel conversion of the data bits, for buffering the data bits, and for providing handshaking between the host processor and the computer printer. In such a computer system, the peripheral adapter typically includes an interface circuit having drivers for driving data conductors in an input/output cable between the peripheral adapter and the printer, and receivers for receiving various status and handshaking data bits from the printer. Because of the resistance and distributed capacitance of the conductors in the input/output cable, the designs of the drivers and receivers in the interface circuit of the peripheral adapter, and a corresponding interface circuit is the printer, are dependent on the length of the input/output cable. Typically, if the length of the input/output cable is less than about 50 feet long, the driver and receiver in the interface circuits are single ended. If, however, the input/output cable is between about 50 feet and 492 feet long, the drivers and receiver in the interface circuits are designed using differential amplifiers.

In the past, separate interface circuits have been provided on removable boards in the peripheral adapter and printer. If the input/output cable was less than 50 feet long, a separate short line interface circuit board was installed in both the peripheral adapter and the printer. If the input/output cable was between 50 feet and 492 feet long, a separate long line interface circuit board was installed in both the peripheral adapter and the printer.

SUMMARY OF THE INVENTION

In one specific embodiment, a multiconfigurable interface circuit for use with a computer input/output cable to a computer peripheral device is disclosed. The interface circuit includes a plurality of drivers, each driver having an input for receiving a computer data bit, and an output for driving a conductor in the input/output cable; a first electrical network for making each of the plurality of drivers compatible with a first predetermined length of input/output cable; and a second electrical network for making each of the plurality of drivers compatible with a second predetermined length of input/output cable. A connection device is provided for selectively connecting either the first electrical network or the second electrical network to the plurality of drivers such that the plurality of drivers are selectively made compatible with a predetermined length of input/output cable.

In the system of the present invention, a single interface circuit is provided having drivers and receivers which may be configured to be compatible with either short line input/output cables or long line input/output cables.

It is thus an object of the present invention to provide a multiconfigurable interface circuit for use with a computer printer which may be configured to be compatible with the length of an input/output cable used with the computer printer.

It is another object of the present invention to provide a multiconfigurable interface circuit which may be changed from one configuration to a second configuration by changing jumper blocks in the interface circuit.

It is another object of the present invention to provide a multiconfigurable interface circuit having a plurality of line drivers configured by a pair of header devices and a jumper block such that when the jumper block is in one of the header devices, the line drivers are configured as single ended drivers, and when the jumper block is in the second of the header devices, the line drivers are configured as differential drivers.

It is another object of the present invention to provide a multiconfigurable interface circuit having a plurality of line receivers configured by a pair of headers and a jumper block such that when the block is in one of the header devices, the line receivers are configured as single ended receivers, and when the jumper block is in the second of the header devices, the line receivers are configured as differential receivers.

These and other objects of the present invention will become apparent from the description of the preferred embodiment and the drawings herein.

DESCRIPTION OF THE PREFERRED EMBODIMENT

Figure 1:
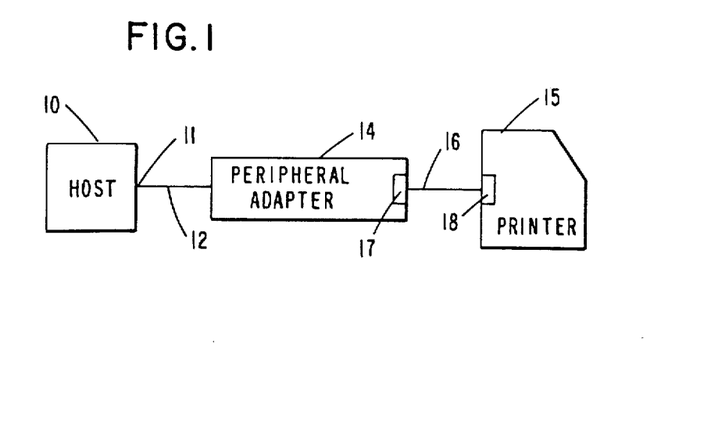
FIG. 1 is a block diagram of a computer system in which the present invention may be used.

FIG. 1 is a block diagram of a computer system in which the present invention may be used. The system includes a host processor 10 having at least one peripheral port 11. A peripheral input/output line 12 is connected between a peripheral adapter 14 and the host processor 10. The peripheral adapter 14 provides serial-to-parallel conversion of data, contains a buffer for storing one line of data for a printer 15, and provides handshaking between the host 10 and the printer 15.

One such peripheral adapter is the 5430-1101 SIA system interface adapter available from the NCR Corporation of Dayton, Ohio 45479. A system interface adapter usable as the peripheral adapter (hereinafter PA) is also disclosed in commonly assigned U.S. Pat. No. 4,387,441 by Kocol et al. issued June 7, 1983 for "Data Processing System Wherein at Least One Subsystem Has a Local Memory and a Mailbox Memory Within the Local Memory for Storing Header Information." Any of several standard line printers may be used for the printer 15. Line printers 6471-020X or 6430-0201 available from NCR Corporation may be used, or a BP Series Line Printer available from Dataproducts Corp., Canoga Park, Calif. 91304 may be used.

An input/output (I/O) cable 16 is connected between the PA 14 and the printer 15. The PA 14 has a PA interface circuit 17, and the printer 15 has a printer interface circuit 18 for connection on either end of the I/O cable 16. As is known, if the I/O cable 16 is less than about 50 feet long, the interface circuits 17 and 18 must be short line interface adapters. However, if the I/O cable 16 is between about 50 feet and 492 feet long, the interface circuits 17 and 18 must be long line interface adapters. Conventional short line interface adapters utilize single ended drivers and receivers at either end of the I/O cable 16, whereas conventional long line interface adapter utilize differential drivers and receivers.

In the present invention, a PA interface circuit 17 is provided in the PA 14 which contains drivers and receivers which may accommodate both short line and long line configurations. The drivers and receivers of the PA interface circuit 17 may be changed between its short line configuration and its long line configuration by changing jumper blocks, to be discussed. The printer interface circuit 18 may be one of the conventional short line or long line adapters, or the printer interface circuit 18 may be similar to the PA interface circuit 17.

Figure 2:
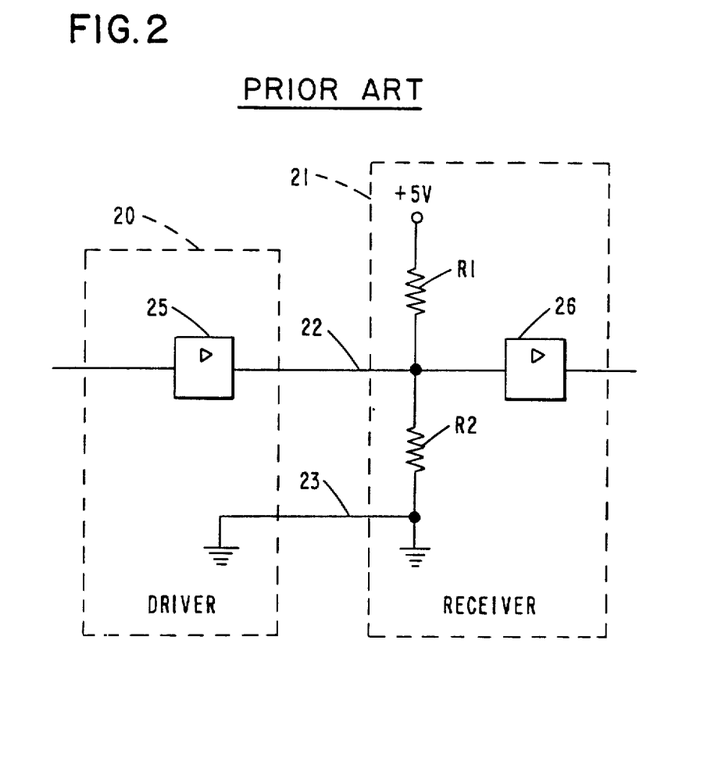
FIG. 2 is a schematic diagram of prior art short line interface adapters.

FIG. 2 is a schematic diagram of one conventional arrangement of the prior art showing a single ended driver 20 and a single ended receiver 21, one on either end of a pair of conductors 22 and 23 of a short line I/O cable (I/O cable 16 of FIG. 1). The single ended driver 20 includes an amplifier 25 for placing a single bit on conductor 22. The single ended receiver 21 includes an amplifier 26 for taking the single bit off of conductor 22. Termination resistors R1 and R2 form a pull-up and pull-down circuit, as is known. One end of R1 is connected to a +5 voltage source, and its other end is connected to the conductor 22, and one end of R2 is connected to the conductor 22, and its other end is grounded. Typically, R1 may be 220 ohms, and R2 may be 330 ohms. Conductor 23 is grounded at each end. A binary bit having either a high or a low value may be transmitted over the conductor 22 by driving the voltage on conductor 22 either high or low with the amplifier 25.

Figure 3:
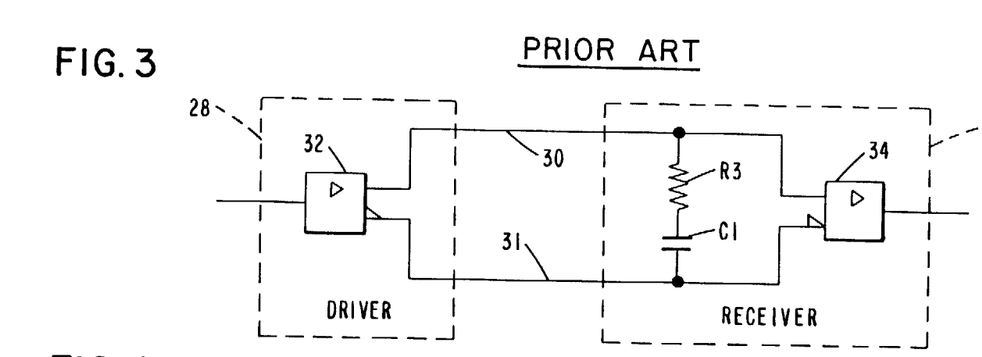
FIG. 3 is a schematic diagram of prior art long line interface adapters.

FIG. 3 is a schematic diagram of one conventional arrangement of the prior art showing one of a differential driver 28 and a differential receiver 29 on either end of a pair of conductors 30 and 31 of a long line I/O cable (I/O cable 16 of FIG. 1). The differential driver 28 includes a differential amplifier 32 having its non-inverted output connected to one end of conductor 30, and its inverted output connected to one end of conductor 31. The differential receiver 29 has a differential amplifier 34 having its inverted input connected to the other end of conductor 31, and its non-inverted input connected to the other end of conductor 30. A resistor R3 is connected in series with a capacitor C1, with the series connected between the inverted and non-inverted inputs of differential amplifier 34. Resistor R3 has a resistance of 150 ohms, and capacitor C1 has a value of 0.01 microfarads. As is known, a binary bit transmitted over conductors 30 and 31 has one value when conductor 30 has a high voltage and conductor 31 has a low voltage, and has a second value when the conductor 30 has a low voltage and the conductor 31 has a high voltage. When the input of the differential driver 28 goes high, the differential amplifier 28 drives conductor 30 high and conductor 31 low. When conductor 30 goes high and conductor 31 low, the output of the differential amplifier 34 is high. When the input of the differential driver 28 is low, the output of the differential receiver 29 is low.

Figure 4:
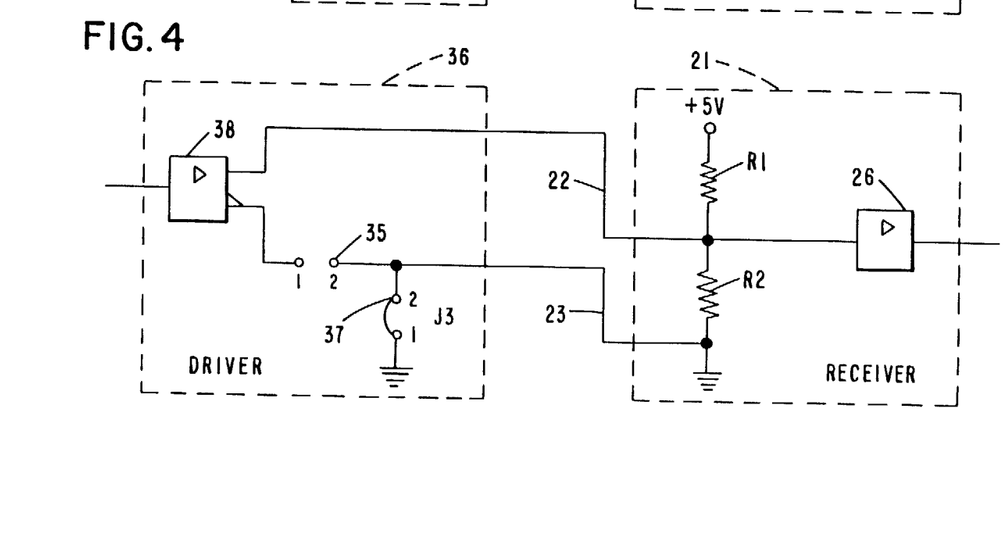
FIG. 4 is a schematic diagram of a system including a driver of the present interface circuit configured as a short line driver.

FIG. 4 is a schematic diagram showing the single ended receiver 21 of FIG. 2 with a driver circuit 36 of the present invention configured for use with a short line I/O cable of conductors 22 and 23. The driver circuit 36 includes a differential line driver 38, which may be ¼ of an AM26LS31 device available from Texas Instruments Incorporated of Dallas, Tex., 75265. The non-inverted output of the differential line driver 38 in FIG. 4 is connected to one end of the conductor 22, which is the same as conductor 22 of FIG. 2. Pins 1 and 2 of a header device 35 is provided at one end of the conductor 23, and pins 1 and 2 of a header device 37 is provided which, when shorted, shunt one end of conductor 23 to ground. In the short line configuration of FIG. 4, a jumper J3 is in place for connecting pins 1 and 2 of header device 37, and pins 1 and 2 of header device 35 are left un-connected such that both ends of the conductor 23 are grounded and the inverted output of differential line driver 38 is not connected. Thus the driver circuit 36 of FIG. 4 has similar characteristics to the single ended driver 20 of FIG. 2.

Figure 5:
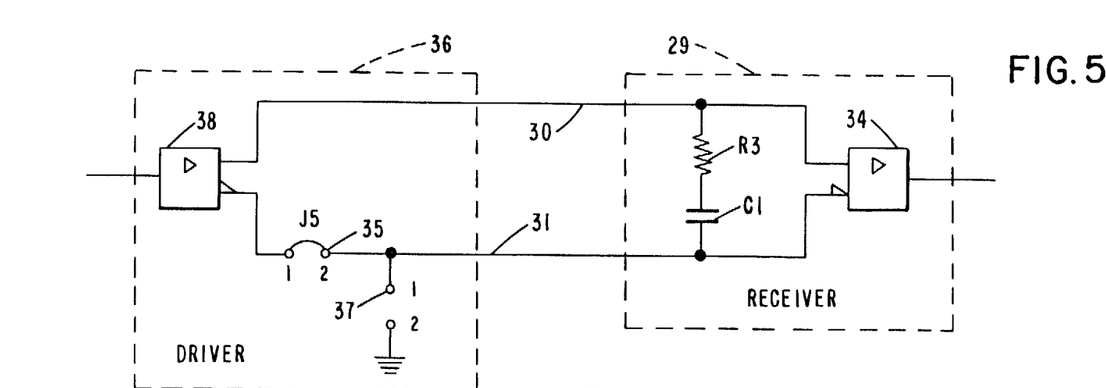
FIG. 5 is a schematic diagram of a system including a driver of the present interface circuit configured as a long line driver.

FIG. 5 is a schematic diagram showing the differential receiver 29 of FIG. 3 with the driver circuit 36 of the present invention configured for use with a long line I/O cable of conductors 30 and 31. The conductors 30 and 31 of FIG. 5 are the same as the conductors 30 and 31 of FIG. 3. In the configuration of FIG. 5, a jumper J5 is in place connecting the pins 1 and 2 of the header device 35, and the jumper J3 is not in place, leaving the pins 1 and 2 of the header device 37 un-connected. In the configuration of FIG. 5, the non-inverted output of the differential line driver 38 is connected to one end of the conductor 30, and the inverted output of the differential line driver 38 in connected, via jumper J5, to one end of the conductor 31. Thus the driver circuit 36 in the configuration of FIG. 5 has similar characteristics to the differential driver 28 of FIG. 3.

Figure 6:
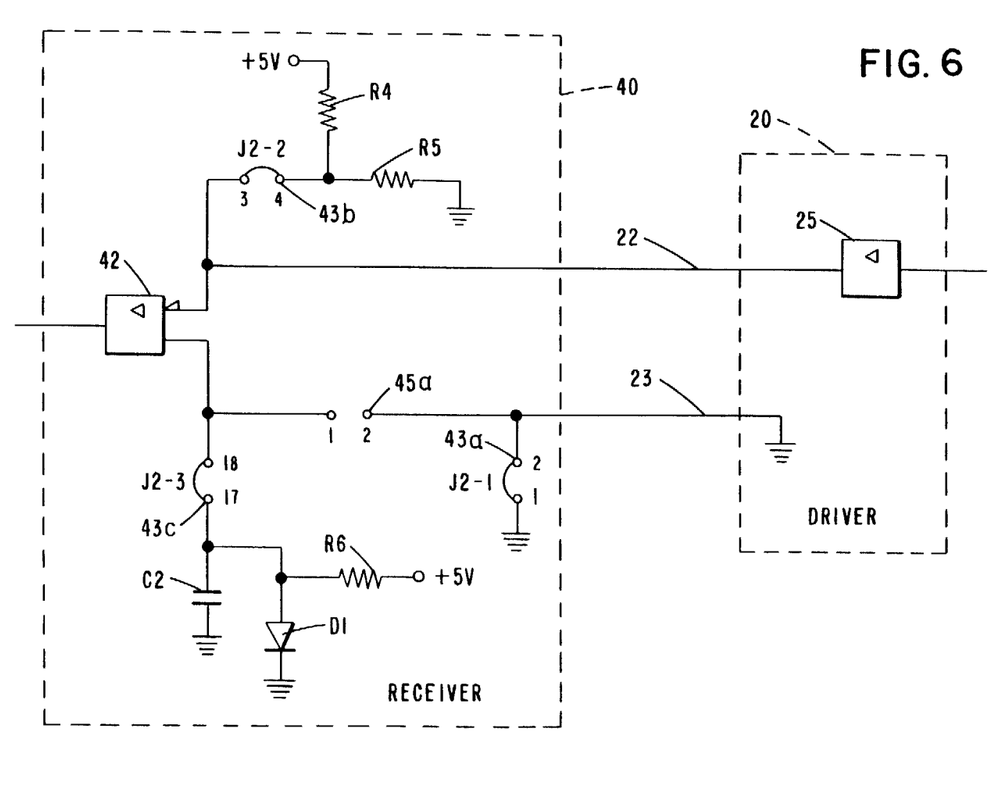
FIG. 6 is a schematic diagram of a system including a receiver of the present interface circuit configured as a short line receiver.
Figure 7:
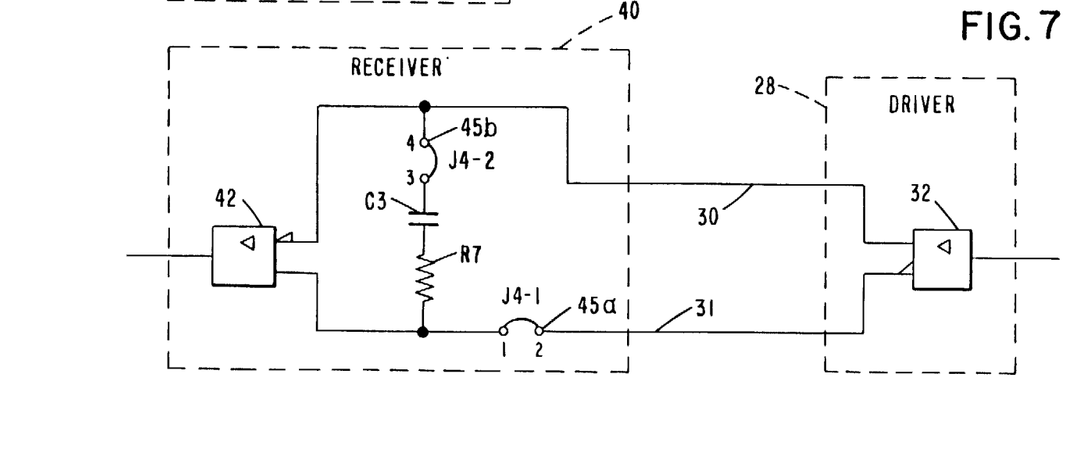
FIG. 7 is a schematic diagram of a system including a receiver of the present interface circuit configured as a long line receiver.

FIG. 6 is a schematic diagram showing the single ended driver 20 of FIG. 2 with a receiver circuit 40 of the present invention configured for use with a short line I/O cable of conductors 22 and 23. The conductors 22 and 23 of FIG. 6 are the same as conductors 22 and 23 of FIG. 2. The receiver circuit 40 actually includes all of the elements shown in the receiver circuits of both FIG. 6 and FIG. 7. However, for clarity, only those elements included in the receiver circuit 40 by the including of jumper J2 (to be explained) are shown in FIG. 6, and only those elements included in the receiver circuit 40 by the including of jumper J4 (to be explained) are shown in FIG. 7. The receiver circuit 40 includes a differential line receiver 42 which may be ¼ of an AM26LS33 device available from Texas Instruments Incorporated.

A header device having pins 1 and 2 at portion 43a, pins 3 and 4 at portion 43, and pins 17 and 18 at portion 43c, is provided. With the jumper J2-1 in place, pins 1 and 2 of the header device portion 43a are connected, grounding each end of the conductor 23. Termination resistors R4 and R5 form a pull-up and pull-down circuit which is connected to conductor 22 by the connecting of pins 3 and 4 of the header device portion 43b with jumper J2-2. Resistor R4 may be a 220 ohm resistor, and resistor R5 may be a 330 ohm resistor. A resistor R6, a diode D1 and a capacitor C2 are all connected to the non-inverted input of the differential amplifier 42 by connecting pins 17 and 18 of header 43c by jumper J2-3. The resistor R6 is a 220 ohm resistor and capacitor C2 is a 0.1 microfarad capacitor. When connected as shown in FIG. 6, a reference voltage of about 0.75 volts is established on the non-inverted input of the differential amplifier 42. A header device portion 45a having pins 1 and 2 is provided between the non-inverted input of the differential amplifier 42 and the conductor 23. In the arrangement of FIG. 6, when the voltage on the conductor 22 is driven by the driver 25 above the reference voltage of 0.75 volts on the non-inverted input of the differential amplifier 42, its output will go negative. Thus, in the arrangement of FIG. 6, the receiver circuit 40 acts like the single ended receiver 29 of FIG. 2 with an inverter.

FIG. 7 is a schematic diagram showing the differential driver 28 of FIG. 3 with the receiver circuit 40 of the present invention configured for use with a long line I/O cable of conductors 30 and 31. The conductors 30 and 31 of FIG. 7 are the same as the conductors 30 and 31 of FIG. 3. The jumpers J2-1, J2-2 and J2-3 of FIG. 6 are not in place, so the circuit elements shown in FIG. 6 are not in the circuit and are omitted in FIG. 7 for clarity. The non-inverted input of the differential line receiver 42 is connected to one end of conductor 30. Pins 1 and 2 of the header device portion 45a are connected by a jumper J4-1, thus connecting the inverted input of the differential line receiver 42 to one end of conductor 31. A resistor R7 in series with a capacitor C3 are connected between conductors 30 and 31 by connecting pins 3 and 4 a header 45b by a jumper J4-2. The resistor R7 has a resistance of 150 ohms, and the capacitor C3 has a value of 0.01 microfarads. Thus in the configuration of FIG. 7, the receiver circuit 40 functions as a differential receiver similar to that of the differential receiver 29 of FIG. 3.

Figure 8A:
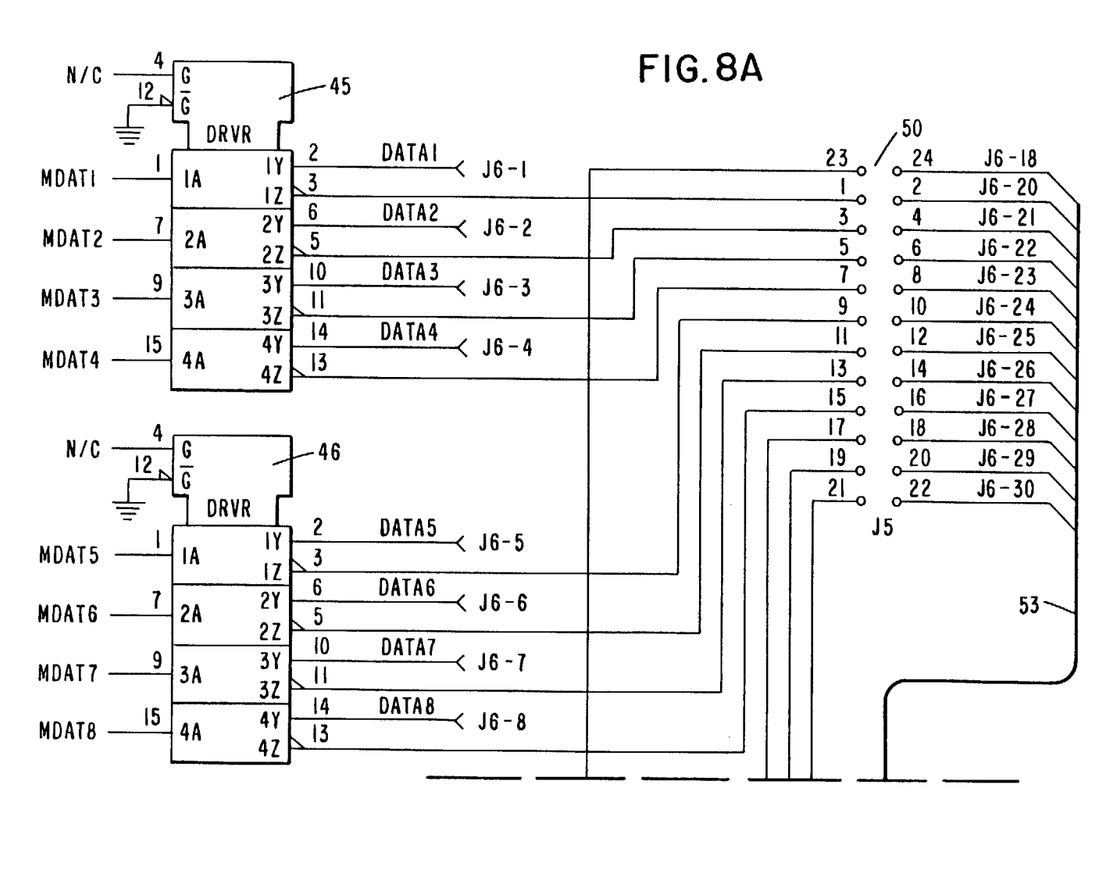
FIGS. 8A and 8B, arranged as shown in FIG. 9, form a schematic diagram of the drivers of the present interface circuit for a peripheral adapter.
Figures 8B, 9:
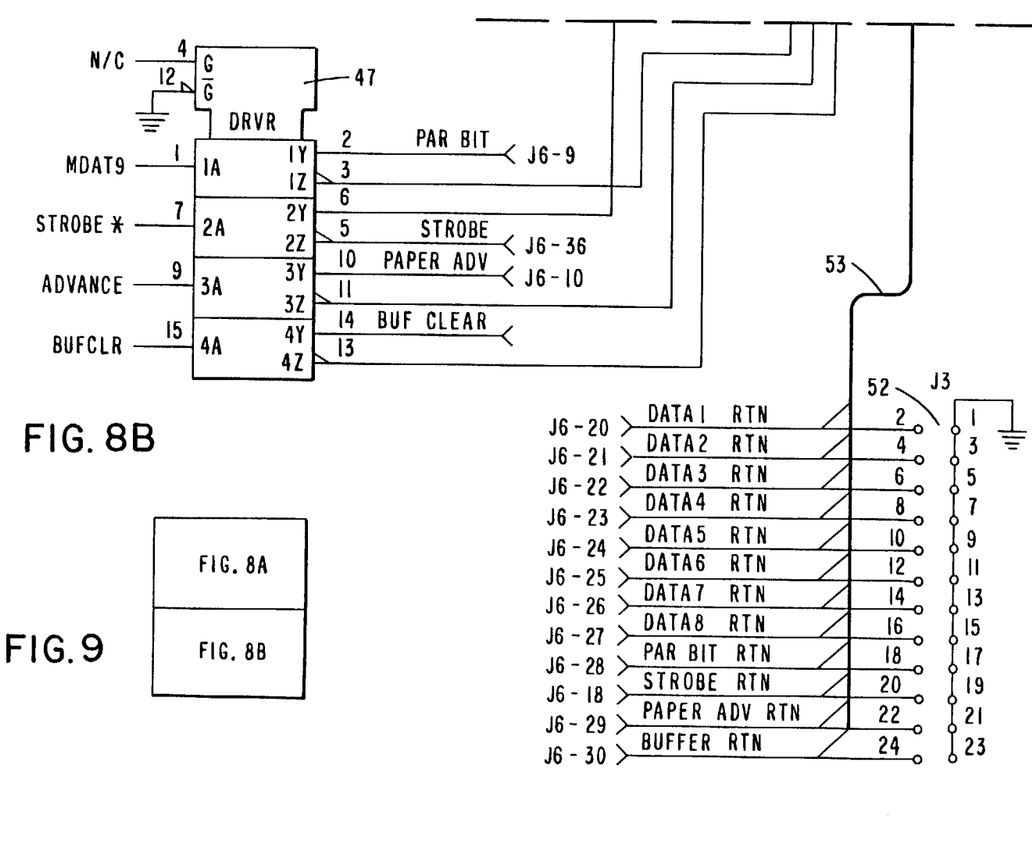

FIGS. 8A and 8B, assembled as shown in FIG. 9, form a schematic diagram for a complete driver circuit for a typical PA-to-printer connection. The circuits of FIGS. 8A and 8B have three quadruple differential line driver devices 45, 46 and 47. Driver devices 45 and 46 receive eight data bits (MDAT1-MDAT8) from the PA 14 (see FIG. 1). Driver device 47 receives a parity bit (MDAT9), a strobe signal (STB*), an advance signal (ADVANCE) and a buffer clear signal (BUFCLR). The non-inverted outputs of the driver devices 45, 46 and 47 are connected to the pins (pins 1-11 and 36) of a pin connector J6 for connection to appropriate conductors in an I/O cable (I/O cable 16 of FIG. 1). The inverted outputs of the line driver devices 45, 46 and 47, are connected to the odd numbered pins of a header device 50. The even numbered pins of the header device 50 are connected to the even numbered pins of a second header device 52 by a bus 53. The odd numbered pins of the header device 52 are grounded. A jumper block J3 (not shown) may be used to jumper the even numbered pins with corresponding odd numbered pins of the header device 52 to form the short line configuration of FIG. 4, and a jumper block J5 (not shown) may be used to jumper the even numbered pins with corresponding odd numbered pins of the header device 50 to form the long line configuration of FIG. 5. The header devices 35 and 37 of FIGS. 4 and 5 correspond to pins 1 and 2 of header devices 50 and 52 respectively. It will thus be understood that the line driver device 38 of FIGS. 4 and 5 receive data bit MDAT1, and output DATA 1 and DATA 1 RTN bits on its outputs.

Figure 10A:
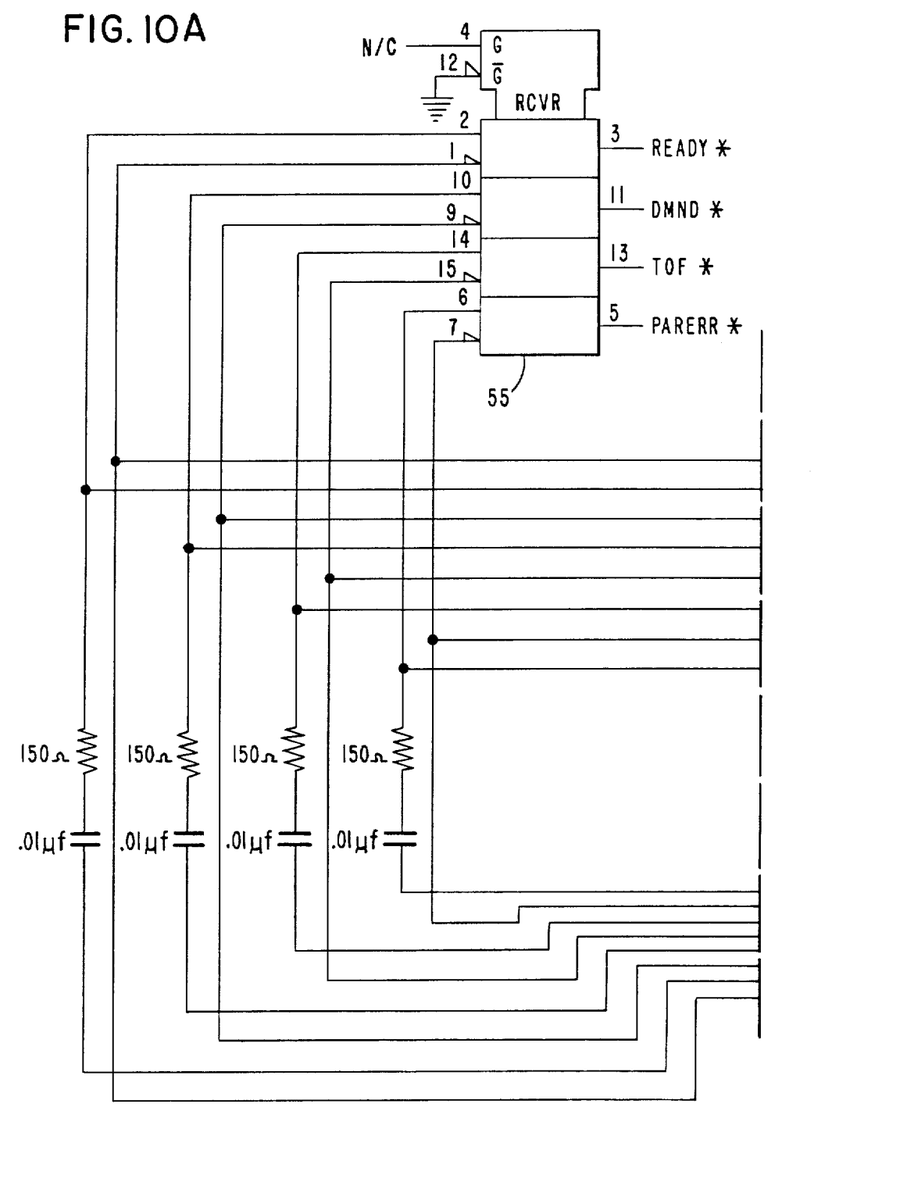
FIGS. 10A, 10B and 10C, arranged as shown in FIG. 11, form a schematic diagram of the receivers of the present interface circuit for a peripheral adapter.
Figure 10B:
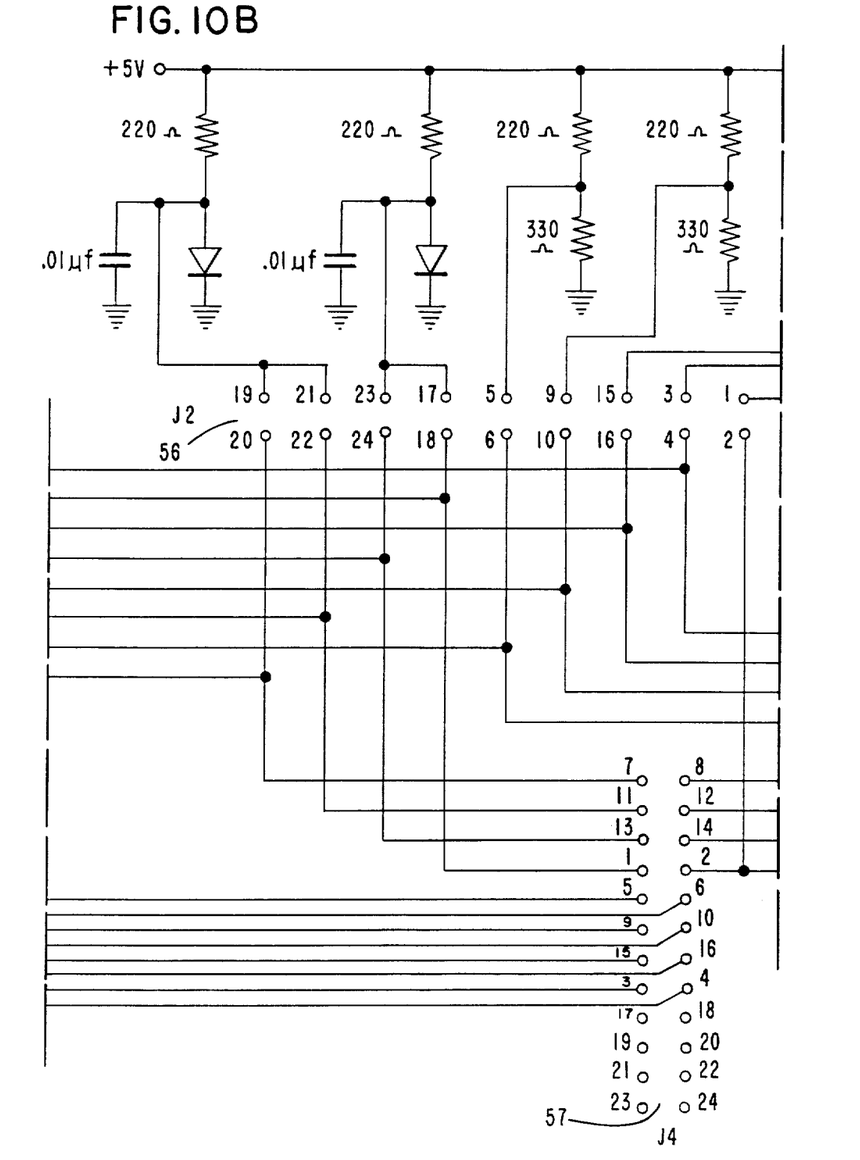
Figure 10C:
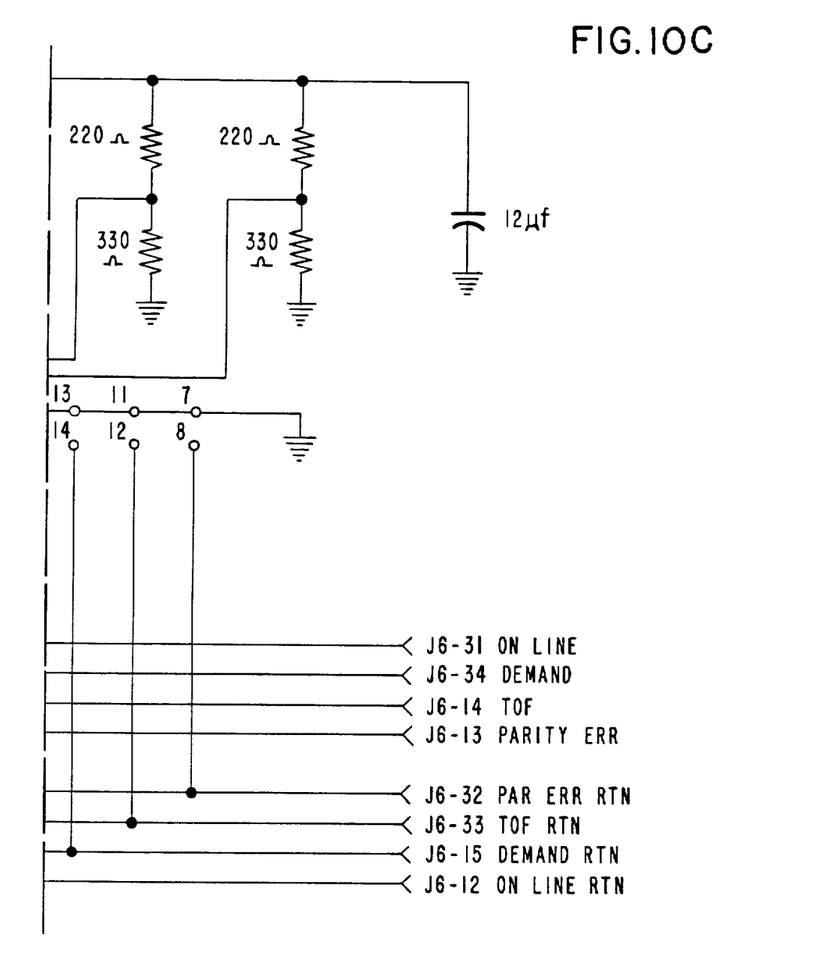
Figure 11:
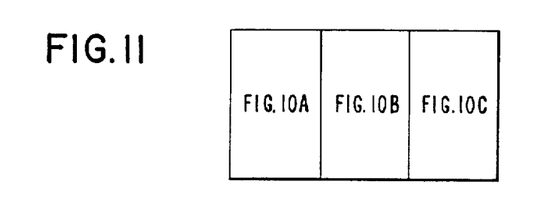

FIGS. 10A, 10B and 10C, assembled as shown in FIG. 11, forms a schematic diagram for a complete receiver circuit for a typical printer-to-PA connection. The circuit of FIG. 10A has a quadruple differential line receiver device 55 whose outputs provide a ready signal (READY*), a demand signal (DMND*), a top of form signal (TOF*) and a parity error signal (PARERR*) to the PA 14 responsive to inputs from the printer 15 (see FIG. 1). Header device 56 of FIGS. 10B and 10C, and header device 57 of FIG. 10B are provided having their pins connected to the inputs of the differential line receiver device 55 of FIG. 10A such that when a jumper block J2 (not shown) is provided for connecting corresponding pins of the header device 56, the differential line receiver device 55 in configured for receipt of signals from a short line I/O cable, and when the jumper block J4 (not shown) is provided for connecting corresponding pins of the header device 57, the differential line receiver device 55 is configured for receipt of signals from a long line I/O cable. Selected pins (see Table I) of the pin connector J6 receive signals from the printer 15, and, dependent on the presence of either jumper J2 or J4, provide the receiver device 55 in either the short line or long line configuration.

The pin numbers of header device portions 43a, 43b and 43c of FIG. 6 correspond to the pin numbers of header device 56, and the pin numbers of the header device portion 45a of FIGS. 1 and 7 and header device portion 45b of FIG. 7 correspond to the pin numbers of header device 57 of FIG. 10b. Thus, FIG. 6 shows the configuration for the receipt of the ON LINE and ON LINE RTN signals from the printer 15 for the generation of the READY* signal for the PA 14 for use with a short line I/O cable configuration, and FIG. 7 shows the configuration for the receipt of the ON LINE and ON LINE RTN signals from the printer 15 for the generation of the READY* signal for the PA 14 for use with a long line I/O cable configuration.

Table I shows the pin assignments of the pin connector J6 for signals to and from the printer 15.

TABLE I

| PIN | DATA | PIN | DATA |
|---|---|---|---|
| 1 | DATA 1 | 20 | DATA 1 RTN |
| 2 | DATA 2 | 21 | DATA 2 RTN |
| 3 | DATA 3 | 22 | DATA 3 RTN |
| 4 | DATA 4 | 23 | DATA 4 RTN |
| 5 | DATA 5 | 24 | DATA 5 RTN |
| 6 | DATA 6 | 25 | DATA 6 RTN |
| 7 | DATA 7 | 26 | DATA 7 RTN |
| 8 | DATA 8 | 27 | DATA 8 RTN |
| 9 | PAR BIT | 28 | PAR BIT RTN |
| 10 | PAPER ADV | 29 | PAPER ADV RTN |
| 11 | BUFFER CLEAR | 30 | BUFFER RTN |
| 12 | ON LINE RTN | 31 | ON LINE |
| 13 | PARITY ERR | 32 | PARITY ERR RTN |
| 14 | TOF | 33 | TOF RTN |

TABLE I-continued

| PIN | DATA | PIN | DATA |
| --- | --- | --- | --- |
| 15 | DEMAND RTN | 34 | DEMAND |
| 16 | GROUND | 35 | — |
| 17 | — | 36 | STROBE |
| 18 | STROBE RTN | 37 | — |
| 19 | — | — | — |

Thus, a system has bene described which provides the aforementioned objects. It will be understood by those skilled in the art that the disclosed embodiment is exemplary only, and that the various elements disclosed may be replaced by equivalents without departing from the invention hereof, which equivalents are covered by the appended claims.

What is claimed is:

1. A multiconfigurable interface circuit for use with a computer input/output cable to a computer peripheral device comprising:
   a plurality of drivers, each driver having an input for receiving a data bit, and output means for driving conductor means with said data bit in the input/output cable;
   first electrical network means for making each of said plurality of drivers compatible with a first predetermined length of input/output cable;
   second electrical network means for making each of said plurality of drivers compatible with a second predetermined length of input/output cable; and
   connection means for selectively connecting either said first electrical network means or said second electrical network means to said plurality of drivers such that said plurality of drivers are selectively made compatible with said first or second predetermined length of input/output cable.

2. The multiconfigurable interface circuit of claim 1 wherein each of said plurality of drivers comprises a differential line driver and wherein said output means has a first and a second output, the first outputs of said output means having means for connection to respective first conductors in said input/output cable;
   said first electrical network means comprises first header means for connecting said second outputs of said differential line drivers to respective second conductors in said input/output cable;
   said second electrical network means comprises second header means for connecting ground to the respective second conductors in said input/output cable; and
   said connection means includes jumper means for connecting either said first header means such that each of the second outputs of said differential line drivers are connected to respective second conductors in said input/output cable, or said second header means such that the second conductors in said input/output cable are grounded.

3. The multiconfigurable interface circuit of claim 1 and further comprising:
   a plurality of receivers, each receiver having an input for receiving said data bit from conductor means in the input/output cable, and an output for providing a signal related to said data bit received on its input;
   third electrical network means for making each of said receivers compatible with said first predetermined length of input/output cable;
   fourth electrical network means for making each of said receivers compatible with said second predetermined length of input/output cable; and
   second connection means for selectively connecting either said third electrical network means or said fourth electrical network means to said plurality of receivers such that said plurality of receivers are selectively made compatible with a said first or second predetermined length of input/output cable.

4. The multiconfigurable interface circuit of claim 3 wherein each of said plurality of receivers includes a differential line receiver having a first and a second input, the first inputs of said differential line receivers having means for connection to respective first conductors in said input/output cable;
   said third electrical network means comprises third header means for connecting said second inputs of said differential line receivers to respective second conductors in said input/output cable;
   said fourth electrical network means comprises fourth header means for connecting ground to the respective second conductors in said input/output cable; and
   said second connection means includes jumper means for connecting either said third header means such that each of said second inputs of said differential line receivers are connected to respective second conductors in said input/output cable, or said fourth header means such that the second conductors in said input/output cable are grounded.

5. The multiconfigurable interface circuit of claim 4 wherein said fourth electrical network means further comprises reference voltage means connected to said fourth header means for placing a reference voltage on each of said second inputs of said differential line receiver when said second connector means connects said fourth header means.

6. The multiconfigurable interface circuit of claim 5 wherein said fourth electrical network means further comprises pull-up and pull-down termination resistors for each of said first inputs of said differential line receivers, said pull-up and pull-down termination resistors being connected to said fourth headers such that said pull-up and pull-down termination resistors are connected to respective first inputs of said differential line receivers when said second connection means connects said fourth header means.

7. The multiconfigurable interface circuit of claim 4 wherein said third electrical network means further comprises a series resistor-capacitor circuit connected in series circuit with said third header means such the said series resistor-capacitor circuit is connected between the first and second inputs of respective ones of the differential line receivers when said connection means connects said third header means.

* * * * *